US009829801B2

(12) United States Patent
Ono

(10) Patent No.: US 9,829,801 B2
(45) Date of Patent: Nov. 28, 2017

(54) EXPOSURE APPARATUS AND DEVICE FABRICATION METHOD

(71) Applicant: NIKON CORPORATION, Tokyo (JP)

(72) Inventor: Kazuya Ono, Saitama (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 15/393,893

(22) Filed: Dec. 29, 2016

(65) Prior Publication Data

US 2017/0108779 A1   Apr. 20, 2017

Related U.S. Application Data

(60) Division of application No. 14/551,702, filed on Nov. 24, 2014, now Pat. No. 9,563,133, which is a division
(Continued)

(30) Foreign Application Priority Data

Oct. 31, 2003  (JP) .................................. 2003-371780

(51) Int. Cl.
 *G03B 27/42* (2006.01)
 *G03B 27/52* (2006.01)
 *G03F 7/20* (2006.01)

(52) U.S. Cl.
 CPC .............. *G03F 7/706* (2013.01); *G03F 7/707* (2013.01); *G03F 7/7085* (2013.01);
(Continued)

(58) Field of Classification Search
 CPC .. G03F 7/70341; G03F 7/70716; G03F 7/707; G03F 7/7085; G03F 7/2041;
(Continued)

(56) References Cited

U.S. PATENT DOCUMENTS 4,346,164 A   8/1982  Tabarelli et al.
4,480,910 A  11/1984  Takanashi et al.
(Continued)

FOREIGN PATENT DOCUMENTS

DE   221 563 A1   4/1985
DE   224 448 A1   7/1985
(Continued)

OTHER PUBLICATIONS

Mar. 15, 2016 Office Action issued in European Patent Application No. 04792452.7.
(Continued)

*Primary Examiner* — Mesfin Asfaw
(74) *Attorney, Agent, or Firm* — Oliff PLC

(57) ABSTRACT

An exposure apparatus includes a projection system, a liquid supply system having a supply opening via which liquid is supplied to a space under the projection system, a liquid recovery system having a recovery opening via which the supplied liquid is collected, a supply flow meter fluidically connected to the supply opening, a stage system having a movable stage apparatus on which a substrate is held, and a measurement system which measures a wavefront aberration and has a light receiving part which receives a light from the projection system through a light-transmissive member provided at the movable stage apparatus and the liquid between the projection system and the light-transmissive member. A liquid immersion area, through which the substrate is exposed, is formed on a portion of an upper surface of the substrate while performing liquid supply via the supply opening and liquid collection via the recovery opening.

23 Claims, 6 Drawing Sheets

Related U.S. Application Data of application No. 12/654,631, filed on Dec. 28, 2009, now Pat. No. 8,928,856, which is a continuation of application No. 11/412,079, filed on Apr. 27, 2006, now abandoned, which is a continuation of application No. PCT/JP2004/015235, filed on Oct. 15, 2004.

(52) U.S. Cl.
CPC ...... *G03F 7/70266* (2013.01); *G03F 7/70341* (2013.01); *G03F 7/70591* (2013.01); *G03F 7/70716* (2013.01); *G03F 7/70825* (2013.01)

(58) Field of Classification Search
CPC .. G03F 7/70775; G03F 7/706; G03F 7/70325; G03F 7/70625; G03F 7/70633; G03F 7/70258; G03F 7/20; G03F 7/704; G03F 7/70358; G03F 7/70433; H01L 21/67017; H01L 21/6715
See application file for complete search history.

(56) References Cited

U.S. PATENT DOCUMENTS

| | | | |
|---|---|---|---|
| 5,528,118 | A | 6/1996 | Lee |
| 5,610,683 | A | 3/1997 | Takahashi |
| 5,623,853 | A | 4/1997 | Novak et al. |
| 5,715,039 | A | 2/1998 | Fukuda et al. |
| 5,825,043 | A | 10/1998 | Suwa |
| 5,859,707 | A | 1/1999 | Nakagawa et al. |
| 5,874,820 | A | 2/1999 | Lee |
| 5,969,441 | A | 10/1999 | Loopstra et al. |
| 6,341,007 | B1 | 1/2002 | Nishi et al. |
| 6,400,441 | B1 | 6/2002 | Nishi et al. |
| 6,650,399 | B2 | 11/2003 | Baselmans et al. |
| 6,690,455 | B2 | 2/2004 | Fujinaka |
| 6,809,794 | B1 | 10/2004 | Sewell |
| 7,301,607 | B2 | 11/2007 | Hazelton et al. |
| 7,388,649 | B2 | 6/2008 | Kobayashi et al. |
| 7,486,380 | B2 | 2/2009 | Hazelton et al. |
| 7,868,997 | B2 | 1/2011 | Ishii et al. |
| 8,305,552 | B2 | 11/2012 | Nishinaga et al. |
| 8,928,856 | B2 | 1/2015 | Ono |
| 2002/0048007 | A1 | 4/2002 | Tsuji et al. |
| 2002/0122163 | A1 | 9/2002 | Inoue |
| 2002/0159040 | A1 | 10/2002 | Hamatani et al. |
| 2002/0159048 | A1 | 10/2002 | Inoue et al. |
| 2003/0137654 | A1 | 7/2003 | Mizuno |
| 2004/0090606 | A1 | 5/2004 | Ishikawa |
| 2004/0136494 | A1 | 7/2004 | Lof et al. |
| 2004/0160582 | A1 | 8/2004 | Lof et al. |
| 2004/0165159 | A1 | 8/2004 | Lof et al. |
| 2004/0207824 | A1 | 10/2004 | Lof et al. |
| 2004/0211920 | A1 | 10/2004 | Maria Derksen et al. |
| 2005/0078287 | A1 | 4/2005 | Sengers et al. |
| 2005/0206850 | A1 | 9/2005 | Shimizu et al. |
| 2005/0264778 | A1 | 12/2005 | Lof et al. |
| 2006/0170891 | A1 | 8/2006 | Nishinaga et al. |

FOREIGN PATENT DOCUMENTS

| | | |
|---|---|---|
| EP | 0 834 773 A2 | 4/1998 |
| EP | 1 024 522 A1 | 8/2000 |
| EP | 1 079 223 A1 | 2/2001 |
| EP | 1429188 A2 | 6/2004 |
| EP | 1 478 010 A1 | 11/2004 |
| EP | 1 628 329 A1 | 2/2006 |
| EP | 1 670 043 A2 | 6/2006 |
| JP | S58-202448 A | 11/1983 |
| JP | S59-019912 A | 2/1984 |
| JP | S62-065326 A | 3/1987 |
| JP | S63-157419 A | 6/1988 |
| JP | H04-305915 A | 10/1992 |
| JP | H04-305917 A | 10/1992 |
| JP | H05-062877 A | 3/1993 |
| JP | H06-124873 A | 5/1994 |
| JP | H06-188169 A | 7/1994 |
| JP | H07-220990 A | 8/1995 |
| JP | H08-166475 A | 6/1996 |
| JP | H08-316125 A | 11/1996 |
| JP | H08-330224 A | 12/1996 |
| JP | H09219354 A | 8/1997 |
| JP | H10-154659 A | 6/1998 |
| JP | H10-163099 A | 6/1998 |
| JP | H10-214783 A | 8/1998 |
| JP | H10-303114 A | 11/1998 |
| JP | H10-340846 A | 12/1998 |
| JP | H11-135400 A | 5/1999 |
| JP | H11-176727 A | 7/1999 |
| JP | 2000-058436 A | 2/2000 |
| JP | 2000-505958 A | 5/2000 |
| JP | 2001-338868 A | 12/2001 |
| JP | 2002156280 A | 5/2002 |
| JP | 2002-202221 A | 7/2002 |
| JP | 2002250677 A | 9/2002 |
| JP | 2003045793 A | 2/2003 |
| JP | 2005-005521 A | 1/2005 |
| JP | 2005-005707 A | 1/2005 |
| JP | 2005-079587 A | 3/2005 |
| WO | 98/28665 A1 | 7/1998 |
| WO | 99/49504 A1 | 9/1999 |
| WO | 02/063664 A1 | 8/2002 |
| WO | 03/065428 A1 | 8/2003 |
| WO | 2004/019128 A2 | 3/2004 |

OTHER PUBLICATIONS

Aug. 3, 2016 Search Report issued in European Patent Application No. 16163200.5.
Aug. 16, 2016 Office Action issued in European Patent Application No. 04792452.7.
Jun. 8, 2016 Notice of Allowance issued in U.S. Appl. No. 14/551,702.
Sep. 23, 2016 Notice of Allowance issued in U.S. Appl. No. 14/551,702.
Dec. 15, 2009 Office Action issued in Japanese Patent Application No. 2005-515108.
Apr. 20, 2010 Notice of Allowance issued in Japanese Patent Application No. 2005-515108.
Feb. 29, 2008 Office Action issued in Chinese Patent Application No. 200480031808.0.
Oct. 10, 2008 Notice of Allowance issued in Chinese Patent Application No. 200480031808.0.
Jan. 4, 2008 European Search Report issued in European Patent Application No. 04792452.7.
Apr. 28, 2008 Office Action issued in European Patent Application No. 04792452.7.
Nov. 12, 2008 Office Action issued in U.S. Appl. No. 11/412,079.
Jun. 25, 2009 Office Action issued in U.S. Appl. No. 11/412,079.
Jan. 25, 2005 International Search Report issued in International Patent Application No. PCT/JP2004/015235.
Jan. 25, 2005 Written Opinion issued in International Patent Application No. PCT/JP2004/015235.
Feb. 22, 2011 Office Action in Taiwanese Patent Application No. 093132912.
Office Action issued Apr. 18, 2011 in Korean Patent Application No. 10-2006-7010220.
Nov. 30, 2011 Office Action issued in Taiwanese Patent Application No. 093132912.
Jul. 10, 2012 Notice of Reasons for Rejection issued in Japanese Patent Application No. 2010-030661.
Jul. 10, 2012 Notice of Reasons for Rejection issued in Japanese Patent Application No. 2010-030662.
Human Translation of Japanese Unexamined Patent Application No. 2003-45793 dated Feb. 14, 2003.
Jul. 22, 2014 Office Action issued in Japanese Patent Application No. 2013-214461.
Apr. 10, 2013 Office Action issued in U.S. Appl. No. 12/654,631.

(56) References Cited

OTHER PUBLICATIONS

Jan. 17, 2014 Notice of Allowance issued in U.S. Appl. No. 12/654,631.
May 8, 2014 Notice of Allowance issued in U.S. Appl. No. 12/654,631.
Aug. 26, 2014 Notice of Allowance issued in U.S. Appl. No. 12/654,631.

EXPOSURE APPARATUS AND DEVICE FABRICATION METHOD

CROSS-REFERENCE TO RELATED APPLICATIONS

This is a Divisional of U.S. patent application Ser. No. 14/551,702, filed Nov. 24, 2014, which in turn is a Divisional of U.S. patent application Ser. No. 12/654,631, filed Dec. 28, 2009 (now U.S. Pat. No. 8,928,856), which in turn is a Continuation of U.S. patent application Ser. No. 11/412,079, filed Apr. 27, 2006 (now abandoned), which is a Continuation of International Application No. PCT/JP2004/015235 filed Oct. 15, 2004, which claims priority to Japanese Patent Application No. 2003-371780 filed Oct. 31, 2003. The disclosures of each of these prior applications are hereby incorporated by reference herein in their entirety.

BACKGROUND OF THE INVENTION

Field of the Invention

The present invention is a technology that relates to an exposure apparatus for exposing a substrate via a projection optical system and a liquid, and a device fabrication method using such an exposure apparatus.

Description of the Related Art

A conventional lithography process for fabricating a semiconductor device, a liquid crystal display device, or the like, uses an exposure apparatus for transferring a pattern (which may be called a "reticle pattern", hereinbelow) formed on a mask or a reticle (generally called a "mask", hereinbelow) via a projection optical system onto a substrate such as a wafer or a glass plate which is coated with a resist or the like. Generally, a still exposure type exposure apparatus (i.e., a stepper) or a scanning type exposure apparatus (a so-called scanning stepper) is generally used.

In such an exposure apparatus, it is necessary to reliably project a pattern formed on the reticle to the substrate with high resolution. Therefore, a method for adjusting the projection optical system has been proposed, in which aberrations remaining in the projection optical system are measured by using, for example, a wavefront aberration measurement technique disclosed in Reference Document 1 (Japanese Published Unexamined Patent Application No. 2002-202221), so as to obtain desired imaging performance and optical characteristics.

There has been a demand in recent years for projection optical systems having higher resolution in order to handle the much higher levels of integration of device patterns. The shorter the exposure wavelength used and the larger the numerical aperture of the projection optical system, the higher the resolution of the projection optical system. Consequently, the exposure wavelength used in exposure apparatuses has shortened year by year, and the numerical aperture of projection optical systems has increased. Furthermore, the mainstream exposure wavelength is currently the 248 nm assigned to KrF excimer laser, but an even shorter wavelength of 193 nm assigned to ArF excimer laser is also being commercialized. In addition, as with resolution, the depth of focus (DOF) is important when performing exposure. The following equations express the resolution R and the depth of focus δ, respectively.

$$R = k_1 \cdot \lambda / NA \quad (1)$$

$$\delta = \pm k_2 \cdot \lambda / NA^2 \quad (2)$$

Therein, λ is the exposure wavelength, NA is the numerical aperture of the projection optical system, and $k_1$ and $k_2$ are process coefficients. Equations (1) and (2) teach that if the exposure wavelength λ is shortened and the numerical aperture NA is increased in order to enhance the resolution R, then the depth of focus δ decreases.

If the depth of focus δ becomes excessively narrow, then it will become difficult to make the relevant surface of the substrate coincide with the image plane of the projection optical system, and there will be a risk of insufficient margin during the exposure operation. Accordingly, a liquid immersion method has been proposed, as disclosed, for example, in Reference Document 2 (the booklet of PCT International Publication No. WO99/49504), as a method to substantially shorten the exposure wavelength and increase the depth of focus. In this liquid immersion method, a gap between the lower surface of the projection optical system and the surface of the substrate is filled with a liquid, such as water or an organic solvent, thus forming a liquid immersion area and taking advantage of the fact that the wavelength of the exposure light in a liquid is 1/n that of in air (where n is the refractive index of the liquid, normally about 1.2 to 1.6), thereby improving the resolution as well as increasing the depth of focus by approximately n times.

As far as is permitted by the relevant national law or regulations, the disclosures of the Reference Documents are each hereby incorporated by reference.

A wavefront aberration measurement method applied to a projection optical system of a liquid immersion exposure apparatus should be performed via a liquid provided between the projection optical system and a wavefront aberration measurement device. If the liquid for exposure leaks and enters inside the wavefront aberration measurement device, the liquid may cause problems such as a failure of the measurement device or leakage of electricity. In such a case, aberrations may not be correctly measured, and the projection optical system may not be controlled, so that exposure operation cannot be preferably performed.

SUMMARY OF THE INVENTION

The present invention was made considering the circumstances discussed above, and it is therefore an object of the present invention to provide an exposure apparatus for preventing leakage or entrance of a liquid used for exposure into an optical measurement device such as a wavefront aberration measurement device, and preferably performing optical adjustment relating to imaging performance or optical characteristics, and also to provide a device fabrication method using the above exposure apparatus.

The present invention provides an exposure apparatus in which a gap between a projection optical system and a substrate which is held by a stage apparatus is filled with a liquid, and a pattern image is projected via the projection optical system and the liquid onto the substrate, so as to expose the substrate, wherein the stage apparatus has a setting portion for setting a measurement device which is detachably attachable to the stage apparatus; and a light-transmissive member which is arranged an optical path of measurement light of the measurement device when the measurement device is set at the setting portion.

In accordance with the present invention which provides the light-transmissive member, the liquid is held on an upper surface of the light-transmissive member; thus, the liquid does not flow outside the light-transmissive member. Therefore, it is possible to prevent the liquid from leaking into or entering the measurement device, thereby preferably performing adjustment relating to optical characteristics.

The present invention also provides an exposure apparatus for forming a predetermined pattern on a substrate by using exposure light, comprising:

a stage apparatus which is movable with respect to an optical axis of the exposure light;

a light-transmissive member provided at the stage apparatus, wherein a liquid is supplied on an upper surface of the light-transmissive member; and a measurement device which is settable below the light-transmissive member when measurement using the measurement device is performed.

The present invention also provides a device fabrication method for fabricating a device using any exposure apparatus as explained above. In accordance with the present invention which provides the light-transmissive member, failure of the measurement device and erroneous measurement due to the liquid being applied to the measurement device can he prevented, thereby enabling accurate optical measurement and adjustment. Therefore, the device can be fabricated in a preferable environment with respect to the exposure apparatus.

In accordance with the present invention, influence on peripheral devices or members, or exposure, due to leakage or entrance of the liquid used for the exposure, can be suppressed or reduced; thus, it is possible to accurately perform an exposure process and to fabricate a device having a desired performance.

DETAILED DESCRIPTION OF THE INVENTION

Figure 1:
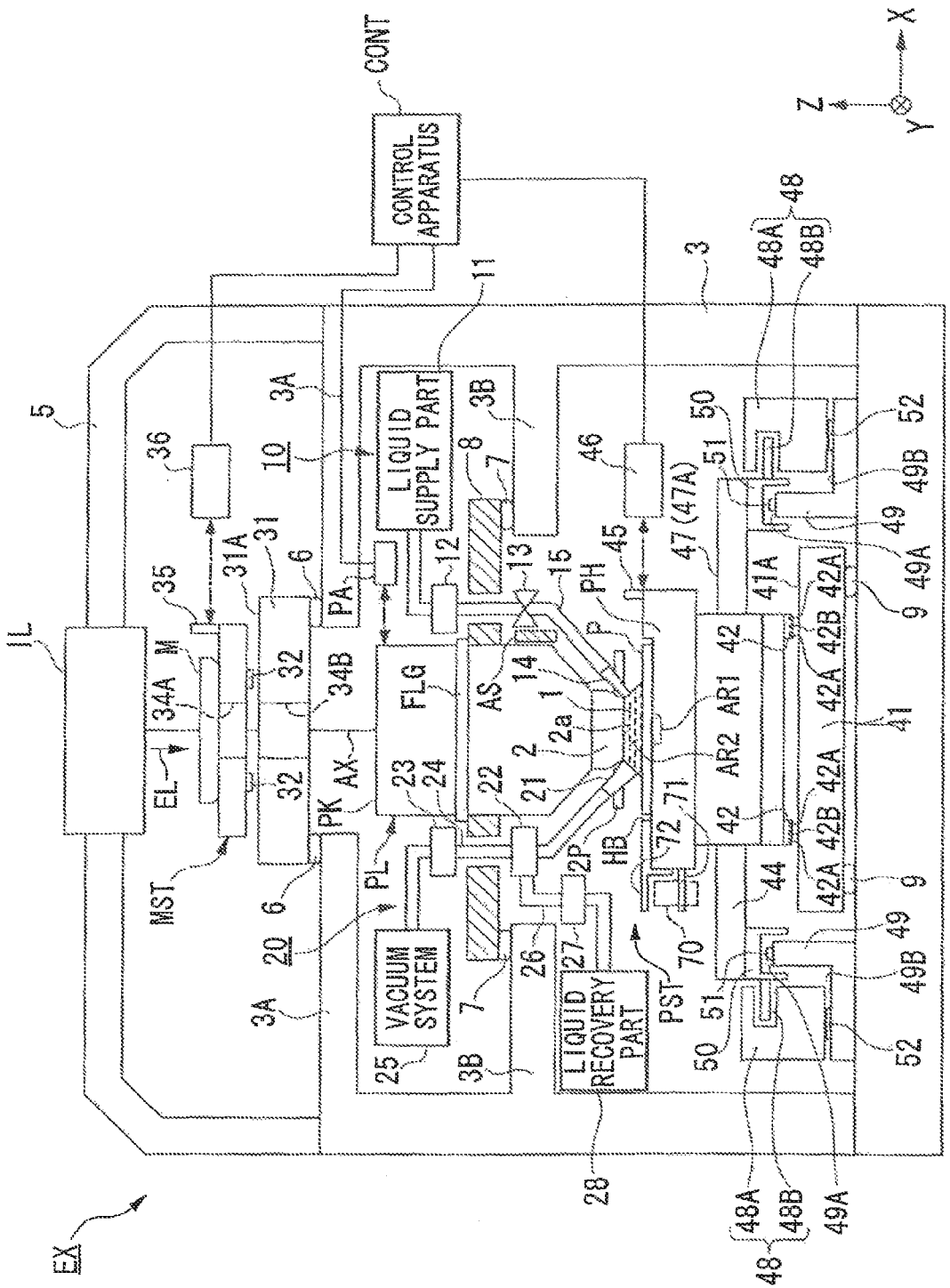
FIG. 1 is a schematic block diagram that depicts an exposure apparatus as a first embodiment in accordance with the present invention.

The following explains the embodiments of an exposure apparatus according to the present invention, referring to the drawings. FIG. 1 is a schematic block diagram that depicts a first embodiment of the exposure apparatus according to the present invention.

In FIG. 1, an exposure apparatus EX has a mask stage MST for supporting a mask M, a substrate stage PST for supporting a substrate P, an illumination optical system IL that illuminates the mask M supported by the mask stage MST with exposure light EL, a projection optical system PL that projects a pattern image of the mask M, which is illuminated by the exposure light EL, onto the substrate P supported by the substrate stage PST, so as to expose the substrate P, and a control apparatus CONT that performs supervisory control of the operation of the entire exposure apparatus EX. The mask stage MST and the projection optical system PL are supported by main columns 3, and each main column 3 is provided on a base plate 4 which is horizontally disposed on a floor surface. The main column 3 has an upper step portion 3A and a lower step portion 3B which protrude inward.

The exposure apparatus EX of the present embodiment is a liquid immersion exposure apparatus employing a liquid immersion method so as to substantially shorten the wavelength for exposure and to substantially increase the depth of focus. Therefore, the exposure apparatus EX has a liquid supply mechanism 10 for supplying a liquid 1 onto the substrate P, and a liquid recovery mechanism 20 for collecting the liquid 1 on the substrate P. The exposure apparatus EX forms a liquid immersion area AR2 on a part of the substrate P by using the liquid 1 (supplied by the liquid supply mechanism 10) at least while the pattern image of the mask M is transferred onto the substrate P, wherein the above part of the substrate P includes a projection area AR1 of the projection optical system PL. Specifically, the exposure apparatus EX fills a gap between an optical element 2 provided at a head (i.e., an end) of the projection optical system PL and a surface of the substrate P with the liquid 1, and exposes the substrate P by projecting the pattern image of the mask M onto the substrate P via the projection optical system PL and the liquid 1 between the projection optical system PL and the substrate P.

The present embodiment explains, as an example, a case of using a scanning type exposure apparatus (a so-called scanning stepper) as the exposure apparatus EX to expose the substrate P with the pattern formed in the mask M, while synchronously moving the substrate P and the mask M in mutually different orientations (reverse directions) in their respective scanning directions. In addition, in the explanation below, the direction that coincides with the optical axis AX of the projection optical system Ph is the Z axial direction, the (scanning) direction in which the mask M and the substrate P synchronously move within the plane perpendicular to the Z axial direction is the X axial direction, and the direction perpendicular to the Z axial direction and the X axial direction (i.e., non-scanning direction) is the Y axial direction. Furthermore, the rotating (or inclination) directions around the X, Y and Z axes are the θX, θY and θZ directions, respectively. The above "substrate" includes a semiconductor wafer coated with a photoresist (i.e., a sensitive material), and the above "mask" includes a reticle on which a device pattern to be reduction-projected onto the substrate is formed.

The illumination optical system IL is supported by a support column 5 fastened to upper portions of the main columns 3. The illumination optical system IL illuminates the mask M, which is supported by the mask stage MST, with the exposure light EL and has an exposure light source; an optical integrator that uniformizes the intensity or illuminance of the luminous flux emitted from the exposure light source; a condenser lens that condenses the exposure light EL from the optical integrator; a relay lens system; and a variable field stop that sets an illumination region on the mask M illuminated by the exposure light EL to be slit-shaped; and the like. Further, the illumination optical system IL illuminates a predetermined illumination region on the mask M with the exposure light EL, which has a uniform luminous flux intensity distribution. Examples of light that can be used as the exposure light EL emitted from the illumination optical system IL include: deep ultraviolet light (DUV light) such as KrF excimer laser light (248 nm wavelength), bright lines (g, h, and i lines) in the ultraviolet region emitted from, for example, a mercury lamp, and vacuum ultraviolet light (VUV light) such as ArF excimer laser light (193 nm wavelength) and $F_2$ laser light (157 nm wavelength). ArF excimer laser light is used in the present embodiment.

In the present embodiment, pure water is used as the liquid 1. Pure water can transmit not only ArF excimer laser light, but also the deep ultraviolet light (DUV light) such as KrF excimer laser light (248 nm wavelength), and the bright lines (g line, h and i line) in the ultraviolet region emitted from, for example, a mercury lamp.

The mask stage MST for supporting the mask M has an opening 34A at the center of the stage, where the pattern image of the mask M passes through the opening 34A. A mask surface plate 31 is supported via a vibration isolation unit 6 by the upper step portions 3A of the main columns 3. The mask surface plate 31 also has an opening 34B at the center thereof, through which the pattern image of the mask M passes. A plurality of gas bearings 32 (here, air bearings), which are contactless bearings, are provided on a lower surface of the mask stage MST. The mask stage MST is supported in a contactless manner on an upper surface 31A (i.e., a guide surface) of the mask surface plate 31 by the air bearings 32, so that the mask stage MST can two-dimensionally move and also finely rotate in the θZ direction by a mask stage driving mechanism such as a linear motor, in a plane perpendicular to the optical axis AX of the projection optical system PL, that is, in the XY plane. A movable mirror 35 is provided on the mask stage MST. In addition, a laser interferometer 36 is provided at a position opposing the movable mirror 35.

Furthermore, the laser interferometer 36 measures in real time the position in the two-dimensional directions and the rotational angle in the θZ direction (the rotation angle in the θX or θY direction may also he measured) of the mask M on the mask stage MST, and outputs these measurement results to the control apparatus CONT.

Furthermore, the control apparatus CONT drives the mask stage driving mechanism based on the measurement results of the laser interferometer 36, and thereby positions the mask M, which is supported by the mask stage MST.

The projection optical system PL projects the pattern of the mask M onto the substrate P at a prescribed projection magnification β so as to expose the substrate P, and has a plurality of lens elements (i.e., optical elements) that includes the optical element 2 (i.e., a lens) provided at a head part on the substrate P side; in addition, these optical elements are supported by a lens barrel PK.

In the present embodiment, the projection optical system PL is a reduction system that has a projection magnification βof, for example, 1/4 or 1/5. Furthermore, the projection optical system PL may be an equal magnification system or an enlargement system. A flange portion FLU is formed at an outer periphery of the lens barrel PK. In addition, a lens barrel surface plate 8 is supported via a vibration isolation unit 7 by the lower step portions 3B of the main columns 3. The flange portion FLG of the projection optical system PL is fit to the lens barrel surface plate 8, so that the projection optical system PL is supported by the lens barrel surface plate 8. Therefore, when an illumination area of the mask M is illuminated by exposure light EL, as described above, a reduced image of the pattern formed on the mask M, that is, a partially-inverted image reduced with a projection magnification β, is projected and transferred onto a slit-form exposure area on the substrate P which is coated with a resist (i.e., a sensitive material).

Among the plurality of lens elements of the projection optical system PL, specific lens elements (e.g., five predetermined lens elements) can respectively and independently move. Such movement of each lens element is performed by a driving device (e.g., three piezoelectric elements provided for the relevant lens element) which supports a lens supporting member supporting the relevant lens element and is coupled with the lens barrel PK. That is, the specific lens elements can be respectively and independently parallel-moved along the optical axis AX in accordance with displacement of each driving device, or each specific lens element can be inclined by a desired degree with respect to a plane perpendicular to the optical axis AX.

Driving signals supplied to the driving devices are controlled by an imaging characteristic correction controller PA, based on commands supplied by the control apparatus CONT, thereby controlling displacement of each driving device, In the projection optical system PL having the above structure, optical characteristics such as distortion, curving of an image surface, astigmatism, coma, or spherical aberration can be adjusted by movement control of the lens elements by the control apparatus CONT via the imaging characteristic correction controller PA.

An alignment microscope AS is provided on a side of the projection optical system PL. As the alignment microscope AS, an off-axis microscope having an imaging alignment sensor is used, by which a street line or a mark (i.e., a fine alignment mark) for position detection, formed on the substrate P, is observed. A detailed structure of the alignment microscope AS is disclosed in Japanese Published Unexamined Patent Application No. H09-219354. Results of observation using the alignment microscope AS are supplied to the control apparatus CONT.

In addition, the optical element 2 provided at the head of the projection optical system PL is detachably (replaceably) provided to the lens barrel PK, and the liquid 1 of the immersion area AR2 contacts the optical element 2. The optical element 2 is made of calcium fluorite. Because calcium fluorite has a strong affinity for water, the liquid 1 can adhere to substantially the entire surface of a liquid contact surface 2a of the optical element 2. Namely, because the liquid (water) 1 supplied has a strong affinity to the liquid contact surface 2a of the optical element 2, the liquid contact surface 2a of the optical element 2 and the liquid 1 have strong adhesion characteristics, and therefore the optical path between the optical element 2 and the substrate P can be reliably filled with the liquid 1 in the present embodiment. Furthermore, the optical element 2 may be made of silica glass, which also has a strong affinity to water. In addition, the liquid contact surface 2a of the optical element 2 may be given hydrophilic (lyophilic) treatment in order to further raise its affinity to the liquid 1.

A plate member 2P is provided so as to surround the optical element 2. The plate member 2P has a flat surface (i.e., a lower surface) which faces the substrate P. The optical element 2 also has a lower flat surface 2a (i.e., the liquid contact surface), and the lower surfaces of the plate member 2P and the optical element 2 are almost coplanar, so that a wide liquid immersion area AR2 can he preferably formed, in addition, the lower surface of the plate member 2P may be subjected to surface treatment (i.e., lyophilic treatment), similarly to that for the optical element 2.

A substrate holder PH for holding the substrate P is moveably provided at the substrate stage PST. On a lower surface of the substrate holder PH, a plurality of gas bearings 42 (here, air bearings), which are contactless bearings, are provided. The substrate holder PH has a recessed portion HB, in which the substrate P is held in an attracted manner. On the base plate 4, a substrate surface plate 41 is supported via a vibration isolation unit 9. Each air bearing 42 has a jetting port 42B for jetting a gas (i.e., air) toward an upper surface 41A (i.e., a guide surface) of the substrate surface plate 41, and intake ports 42A for attracting a gas between a lower surface (i.e., bearing surface) of the substrate stage PST and the guide surface 41A. In accordance with balance between repulsion due to air jetting from the jetting port 42B and attraction using the intake ports 42A, a specific gap is secured between the lower surface of the substrate stage PST and the guide surface 41A. That is, the substrate stage PST is supported by the air bearings 42 in a contactless manner on the upper surface 41A (i.e., the guide surface) of the substrate surface plate 41 (i.e., a base member), and can two-dimensionally move and finely rotate in the θZ direction by a substrate stage driving mechanism such as a linear motor, in a plane perpendicular to the optical axis AX of the projection optical system PL, that is, in the XY plane. In addition, the substrate holder PK can also move in the Z-axis, θX, and θY directions. The substrate stage driving mechanism is controlled by the control apparatus CONT. That is, the substrate holder PH controls the focal position (i.e., the position in the Z direction) and the inclination angle of the substrate P, so as to match the target surface of the substrate P to an imaging plane of the projection optical system Ph by using autofocusing and auto-leveling methods, and also positions the substrate P in the X and Y directions.

A movable mirror 45 is provided on the substrate stage PST (i.e., on the substrate holder PH). In addition, a laser interferometer 46 is provided at a position opposing the movable mirror 45. Furthermore, the laser interferometer 46 measures in real time the position in the two-dimensional directions and the rotational angle of the substrate P on the substrate stage PST, and outputs these measurement results to the control apparatus CONT. Furthermore, the control apparatus CONT drives the substrate stage driving mechanism, which includes a linear motor, based on the measurement results of the laser interferometer 46, and thereby positions the substrate P, which is supported by the substrate stage PST.

At a part of the peripheral edge of the substrate stage PST (i.e., of the substrate holder PH), a bracket 71 (i.e., a setting portion) for detachably attaching a wavefront aberration measurement apparatus 70 (i.e., a measurement device) for measuring optical characteristics of the projection optical system PL (details explained later), and a cover 72 (i.e., a light-transmissive material) for protecting the wavefront aberration measurement apparatus 70 from the liquid 1 and simultaneously transmitting measurement light of the wavefront aberration measurement apparatus 70 are provided.

Figure 2:
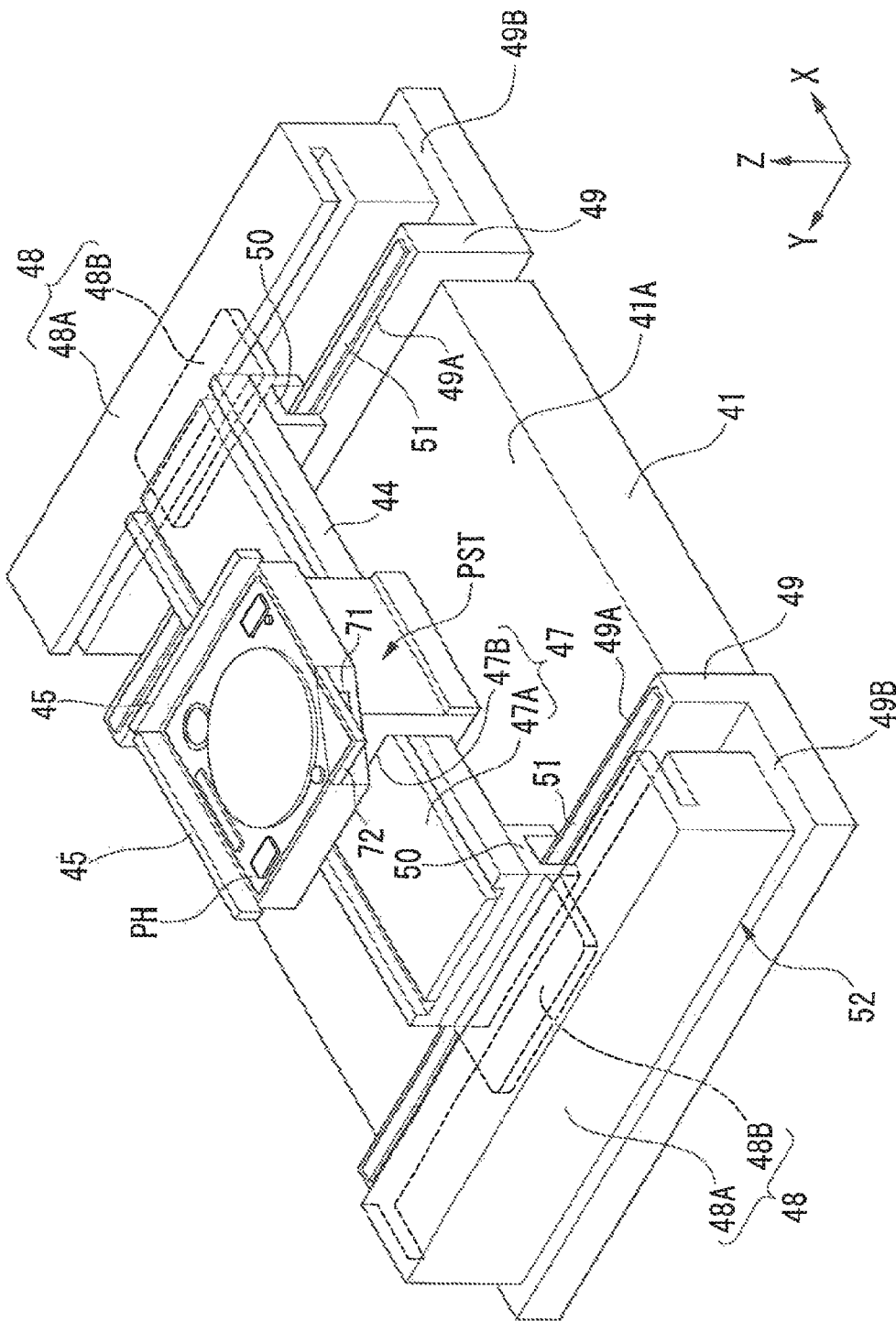
FIG. 2 is a perspective view showing the substrate stage.

FIG. 2 is a schematic perspective view showing the substrate stage PST and the substrate stage driving mechanism for driving the substrate stage PST. In FIG. 2, the substrate stage PST is supported by an X guide stage 44 in a manner such that the substrate stage PST can freely move in the X direction. The substrate stage PST is guided by the X guide stage 44 and can also move by a specific stroke in the X direction by an X linear motor 47. The X linear motor 47 has a stator 47A provided at the X guide stage 44 in a mariner such that the stator 47A extends in the X direction, and a movable portion 47B which is provided corresponding to the stator 47A and is fastened to the substrate stage PST. The substrate stage PST moves in the X direction when the movable portion 47B moves with respect to the stator 47A. The substrate stage PST is supported in a contactless manner by a magnetic guide which has a magnet for securing a specific gap between the substrate stage PST and the X guide stage 44 in the Z direction and an actuator. The substrate stage PST moves in the X direction while being supported in the contactless manner by the X guide stage 44.

A pair of Y linear motors 48 for moving the X guide stage 44 together with the substrate stage PST along the Y axis are provided at both ends of the X guide stage 44 along the length thereof. Each of the Y linear motors 48 has a movable portion 48B provided on an end of the X guide stage 44 along the length thereof, and a stator 48A provided corresponding to the movable portion 48B.

The X guide stage 44 moves together with the substrate stage PST in the Y direction when the movable portions 48B move with respect to the stators 48A. The X guide stage 44 can also rotationally move in the θZ direction by controlling driving of each Y linear motor 48. Therefore, in accordance with the Y linear motors 48, the substrate stage PST can move in the Y direction and the θZ direction, almost integrally with the X guide stage 44.

Guide portions 49, each having an L-shape in plan view, are respectively provided at both ends of the substrate surface plate 41 along the X axis, so as to guide the movement of the X guide stage 44 along the Y axis. The guide portions 49 are supported on the base plate 4. In the present embodiment, the stator 38A is disposed on a flat portion 49B of each guide portion 49. In addition, guided members 50, each having a recessed shape, are respectively provided at both ends of a lower surface of the X guide stage 44 along the length thereof. Each guide portion 49 is engaged with each corresponding guided portion 50, where an upper surface 49A (i.e., a guide surface) of the guide portion 49 faces an inner surface of the guided portion 50. On the guide surface 49A of each guide portion 49, a gas bearing 51 (here, an air bearing), which is a contactless bearing, is provided so that the X guide stage 44 is supported on the guide surfaces 49A in a contactless manner.

In addition, a gas bearing 52 (here, an air bearing), which is a contactless bearing, is provided between the stator 48A of each Y linear motor 48 and the flat portion 49B of each guide portion 49, so that the stator 48A is supported on the flat portion 493 of the guide portion 49 in a contactless manner. Therefore, due to a theorem of conservation of momentum, the stators 48A move in the −Y (or +Y) direction in accordance with movement of the X guide stage 44 and the substrate stage PST in the +Y (or −Y) direction. This movement of the stators 48A cancels the reaction accompanied with the movement of the X guide stage 44 and the substrate stage PST, and thereby preventing displacement of the position of the center of gravity. That is, the stators 48A function as a so-called counter mass.

The substrate stage PST having the above-described structure can move not only in the scanning direction (i.e., the Y direction), but also in a direction perpendicular to the scanning direction (i.e., in the X direction), so as to position each of a plurality of shot areas on the substrate P to an exposure area which is conjugate with the above-mentioned illumination region. In accordance with a driving signal from the control apparatus CONT, an operation for scanning and exposing each shot area on the substrate P, and an operation of moving the substrate toward an exposure start position for the next shot are repeated (i.e., a step and scan operation). Therefore, the substrate stage PST can two-dimensionally move and rotate in the θZ direction.

Figure 3:
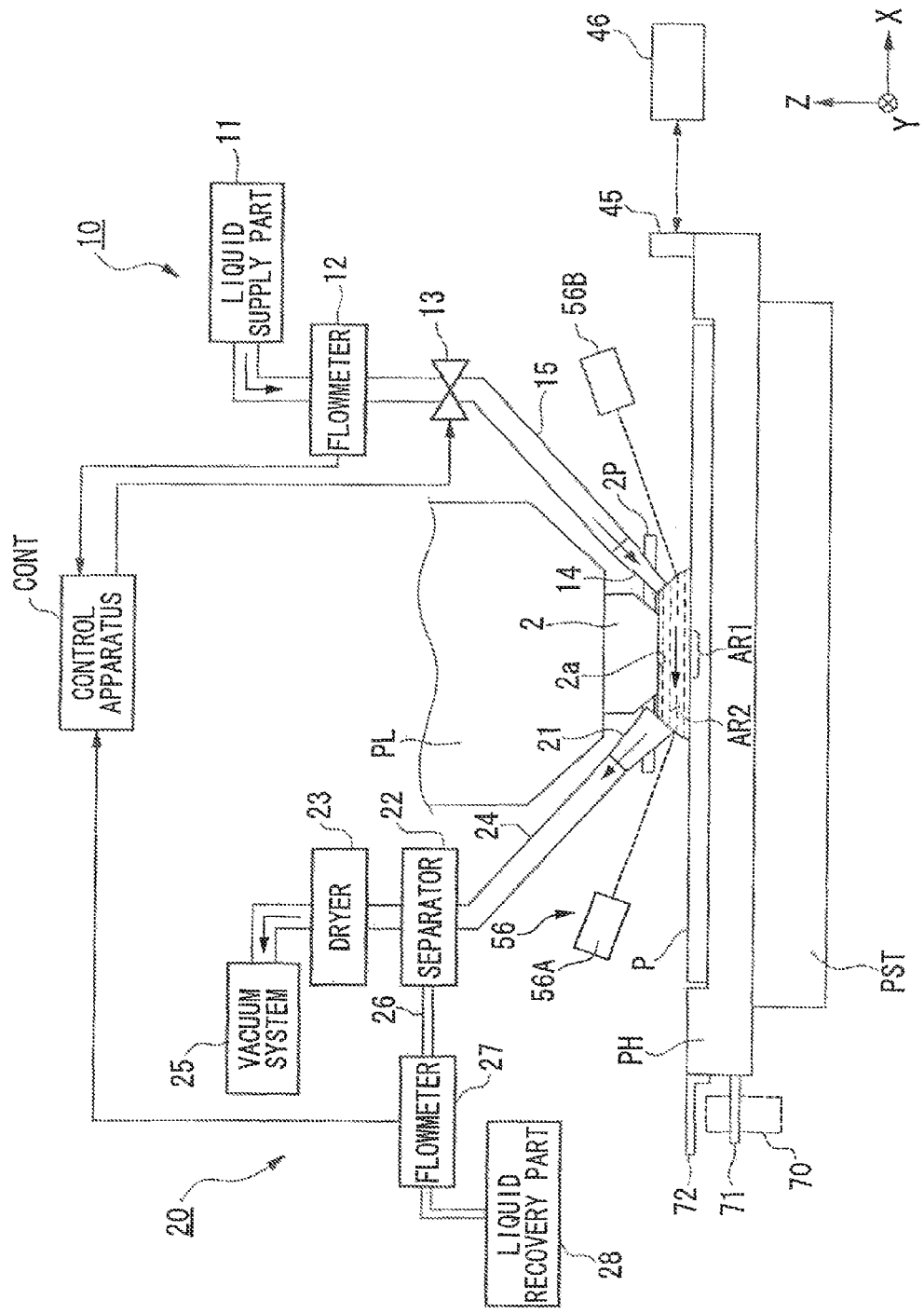
FIG. 3 is a schematic structural view showing a vicinity of the head of the projection optical system, the liquid supply mechanism, and the liquid recovery mechanism.

FIG. 3 is an enlarged view showing the liquid supply mechanism 10, the liquid recovery mechanism 20, and a vicinity of the head of the projection optical system PL. The liquid supply mechanism 10 supplies the liquid 1 to a gap (or space) between the projection optical system PL and the substrate P, and has a liquid supply part 11 which can supply the liquid 1, and a supply nozzle 14, connected via a supply pipe 15 to the liquid supply part 11, for supplying the liquid 1 (provided from the liquid supply part 1) onto the substrate P. The supply nozzle 14 is arranged in the vicinity of the relevant surface of the substrate P. The liquid supply part 11 has a tank containing the liquid 1, a booster pump, or the like, and supplies the liquid 1 via the supply pipe 15 and the supply nozzle 14 onto the substrate P. The liquid supply operation of the liquid supply part 11 is controlled by the control apparatus CONT, and the control apparatus CONT can control the amount of liquid to be supplied per unit time onto the substrate P by the liquid supply part 11.

In the middle of the supply pipe 15, a flowmeter 12 for measuring the amount of the liquid 1 supplied from the liquid supply part 11 to the substrate P (i.e., the amount of supplied liquid per unit time) is provided. The flowmeter 12 continuously monitors the amount of the liquid 1 supplied to the substrate P, and outputs a result of the measurement to the control apparatus CONT.

In addition, a valve 13 for opening and closing the flow path of the supply pipe 15 is also provided in the middle of the supply pipe 15, between the flowmeter 12 and the supply nozzle 14. The opening/closing operation of the valve 13 is controlled by the control apparatus CONT.

The liquid recovery mechanism 20 is provided for collecting the liquid 1 supplied to the substrate P by the liquid supply mechanism 10, and has a recovery nozzle 21 (i.e., a suction port) arranged in the vicinity of the relevant surface of the substrate P, and a vacuum system 25 connected via a recovery pipe 24 to the recovery nozzle 21. The vacuum system 25 has a vacuum pump, and the operation of the vacuum system 25 is controlled by the control apparatus CONT. When the vacuum system 25 is driven, the liquid 1 on the substrate P is collected together with a gas (i.e., air) around the liquid, via the recovery nozzle 21. As the vacuum system 25, instead of providing a vacuum pump at the exposure apparatus EX, a vacuum system of the factory, in which the exposure apparatus EX is provided, may be used.

In the middle of the recovery pipe 24, a gas-liquid separator 22 for separating the liquid 1 and the gas, both suctioned through the recovery nozzle 21, is provided. As described above, not only the liquid 1 on the substrate P, but also the gas around the liquid 1, is collected through the recovery nozzle 21. The gas-liquid separator 22 separates the liquid 1 and the gas, collected through the recovery nozzle 21, from each other. The gas-liquid separator 22 may employ a gravitation separation method in which the collected liquid and gas are made to flow through a pipe member having a plurality of holes so as to make the liquid flow through the holes due to a gravitation function, a centrifugation method for separating the collected liquid and gas using centrifugal force, or the like. The vacuum system 25 attracts the gas separated by the gas-liquid separator 22.

A dryer 23 is provided in the middle of the recovery pipe 24, between the vacuum system 25 and the gas-liquid separator 22. Even if a liquid component is included in the gas separated by the gas-liquid separator 22, the gas is dried using the dryer 23, and the dried gas is drawn into the vacuum system 25, thereby preventing problems such as a failure of the vacuum system 25 due to inclusion of the liquid component. The dryer 23 may employ a method for removing the liquid component by (i) cooling the gas (which includes the liquid component) supplied from the gas-liquid separator 22 to have a temperature equal to or lower than the dew point of the liquid or (ii) heating the gas to have a temperature equal to or higher than the boiling point of the liquid, or the like.

The liquid 1 separated by the gas-liquid separator 22 is stored in a liquid recovery part 28 via a second recovery pipe 26. The liquid recovery part 28 has a tank for storing the collected liquid 1. The liquid 1 stored in the liquid recovery part 28 may be disposed of, or cleaned and returned to the liquid supply part 11 or the like, so as to be used again. In addition, a flowmeter 27 for measuring the amount of the collected liquid 1 (i.e., the amount of the collected liquid per unit time) is provided in the middle of the second recovery pipe 26, between the gas-liquid separator 22 and the liquid recovery part 28. The flowmeter 27 continuously monitors the amount of the liquid 1 collected from the substrate P, and outputs a result of the measurement to the control apparatus CONT. As described above, not only the liquid 1 on the substrate P, but also a gas around the liquid 1 is collected through the recovery nozzle 21. However, the liquid 1 and the gas are separated from each other by using the gas-liquid separator 22, and only the liquid part is sent to the flowmeter 27, thereby accurately measuring the amount of the liquid 1 collected from the substrate P by the flowmeter 27.

The exposure apparatus EX also has a focus measurement system 56 for measuring the position on the surface of the substrate P supported by the substrate stage PST. The focus measurement system 56 has a light-emitting part 56A for emitting a measurement light beam to the substrate P through the liquid 1 along an inclined path, and a light-receiving part 56B for receiving light reflected by the substrate P from the measurement light beam. The focus measurement system 56 outputs a result of the measurement (via the light-receiving part 56B) to the control apparatus CONT. Based on this result of the measurement, the control apparatus CONT can obtain position data along the Z axis on the surface of the substrate P. In addition, when a plurality of measurement light beams are emitted from the light-emitting part 56A, data of inclination of the substrate P in the θX and θY directions can be obtained.

As shown in the partially-sectional view of FIG. 1, the liquid supply mechanism 10 and the liquid recovery mechanism 20 are separately supported with respect to the lens barrel surface plate 8. Therefore, vibration which occurs in the liquid supply mechanism 10 or the liquid recovery mechanism 20 is not transmitted via the lens barrel surface plate 8 to the projection optical system PL.

Figure 4:
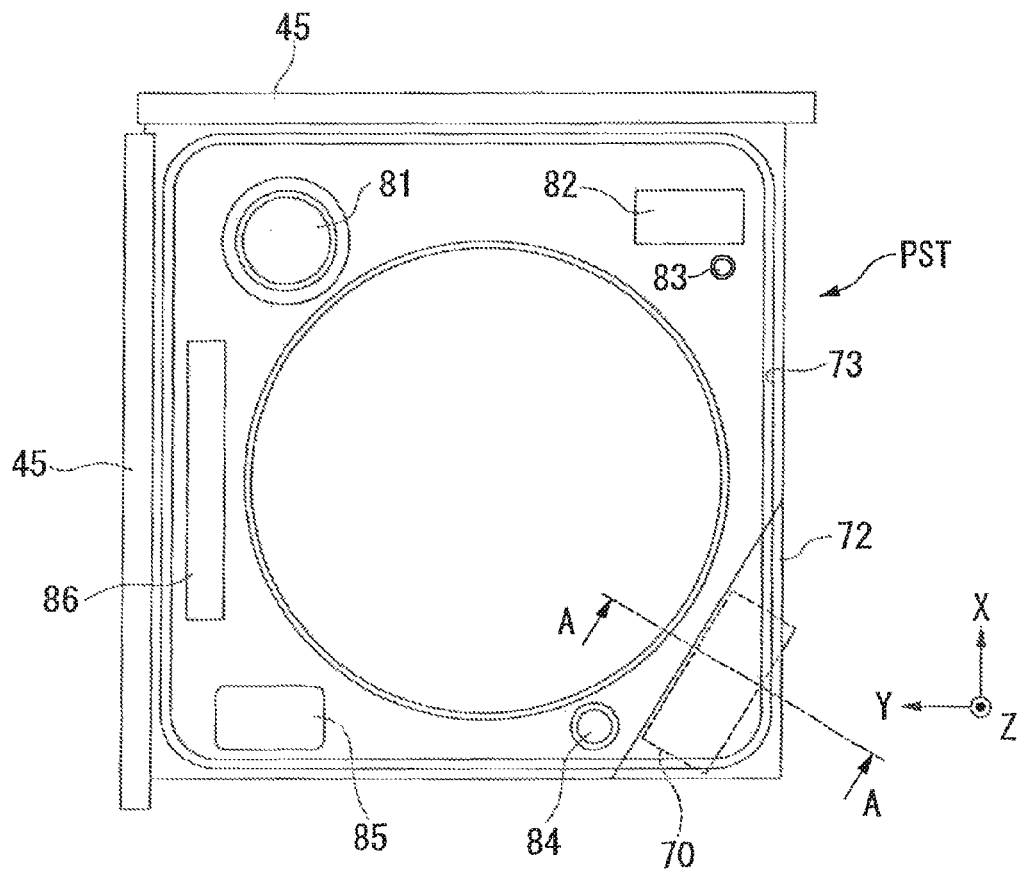
FIG. 4 is a plan view showing the substrate holder.
Figure 5:
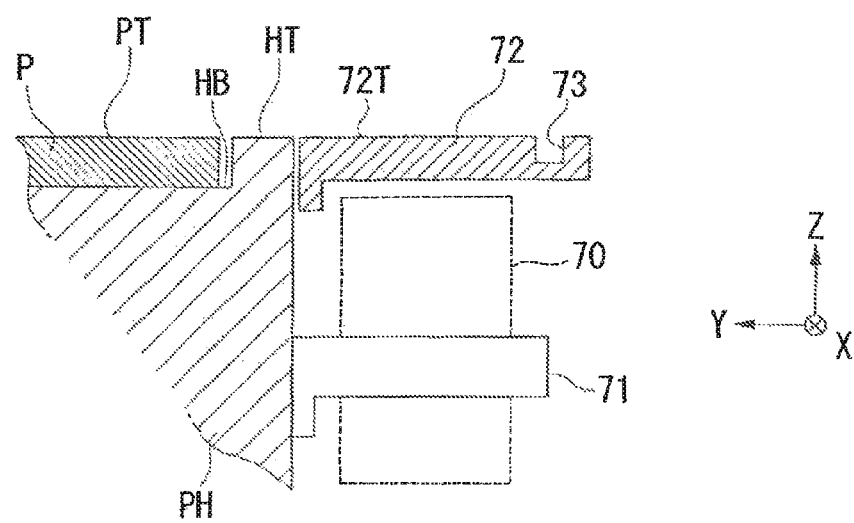
FIG. 5 is a side sectional view along line A-A of FIG. 4.

FIG. 4 is a plan view of the substrate stage PST (or substrate holder PH). FIG. 5 is a sectional view along line A-A of FIG. 4, that is, a side sectional view of the substrate stage PST. On the upper surface of the substrate holder PH, a reference flat plate 81, an irradiation monitor 82, an unevenness sensor 83, an AIS light-emitting part 84, an MS pattern plate 85, and a fiducial mark (FM) 86. As described above, the bracket 71 and the cover 72 are provided at a part of the periphery of the substrate holder PH. The bracket 71 is provided for detachably attaching the wavefront aberration measurement apparatus 70 for measuring the optical characteristics of the projection optical system PL, and is always provided at a side of the substrate holder PH. The cover 72 corresponds to the light-transmissive material of the present invention, and is provided for (i) protecting the wavefront aberration measurement apparatus 70 from the liquid 1 leaked from the substrate holder PH when performing optical measurement by attaching the wavefront aberration measurement apparatus 70 to the bracket 71, and (ii) transmitting measurement light of the wavefront aberration measurement apparatus 70.

During the exposure operation, the wavefront aberration measurement apparatus 70 is detached from the bracket 71, and is attached to the bracket 71 when measuring the wavefront aberration of the projection optical system PL so as to perform optical adjustment in a maintenance process of the exposure apparatus EX.

This cover 72 is positioned on the optical path of the measurement light of the wavefront aberration measurement apparatus 70. The material of the cover 72 is not limited but must be light-transmissive, and may be glass, silica glass, transparent resin, or the like. In addition, an upper surface 72T of the cover 72 is liquid-repellent.

Preferably, in order to obtain the liquid-repellency on the upper surface 72T, a known liquid-repellent treatment (i.e., a surface treatment) is performed. However, such a liquid-repellent treatment is unnecessary when the material itself of the cover 72 has sufficient liquid-repellency.

In addition, in the Z direction (i.e., along the optical axis of the measurement light of the wavefront aberration measurement apparatus 70), the cover 72 is arranged in a manner such that the position of the upper surface 72T of the cover 72 and the upper surface HT of the substrate holder PH are substantially the same. Also in the Z direction, the substrate P is attracted and held in the recessed portion HB formed in the substrate holder PH, so that the position of the upper surface HT of the substrate holder PH substantially coincides with the position of the upper surface PT of the substrate P.

In peripheral edges of the substrate holder PH and the cover 72, a groove portion 73 (i.e., a recessed or protruding part) is formed, which surrounds the reference flat plate 81, the irradiation monitor 82, the unevenness sensor 83, the AIS light-emitting part 84, the AIS pattern plate 85, and the fiducial mark (FM) 86. As described later, this groove portion 73 prevents the liquid 1 from leaking outside the substrate holder PH and also prevents the wavefront aberration measurement apparatus 70 from being exposed to the liquid 1.

The cover 72 and the substrate holder PH are fastened to each other by using a fastening member such as a screw. The substrate holder PH can have no distortion depending on the fastening stress of the fastening member. In order to position the upper surface 72T of the cover 72 and the upper surface HT of the substrate holder PH with high accuracy, a positioning pin adjacent to the fastening member is preferably provided. In addition, the clearance at the joint portion between the substrate holder PH and the cover 72 is preferably a few μm or less. Specifically, a clearance by which the liquid 1 does not enter the joint portion due to liquid-repellency of the upper surface 72T of the cover 72 is required.

The clearance (or gap) between the substrate holder PH and the cover 72 may be approximately 0.1 to 1 mm, or may be 0.3 mm or less. Under such a condition, entrance of the liquid 1 into the above gap can be almost completely avoided due to surface tension of the liquid 1. However, the present invention is not limited to such a case, and the cover 72 may closely contact the substrate holder PH. In addition, the cover 72 may have a structure by which the cover 72 can be replaceably attached to the substrate holder PH, so that the cover 72 can be replaced when the cover 72 is contaminated with the liquid.

The bracket 71 has sufficient strength for holding the wavefront aberration measurement apparatus 70 when this apparatus is used. Similarly to the cover 72, the bracket 71 is fastened to the substrate holder PH in a manner by which the substrate holder PH has no distortion.

In the present embodiment, the groove portion 73 is formed as a holding part for holding the liquid 1 at the peripheral edges of the cover 72 and the substrate holder PH; however, such a recessed part is not always required, and a protruding part may be formed instead.

In addition, the cover 72 may be provided as a part of optical elements for implementing the wavefront aberration measurement apparatus 70, for example, may have a function as a lens. When providing such a lens function to the cover 72, a convex or concave lens is preferably provided to the back face (which faces the wavefront aberration measurement apparatus 70) of the cover 72.

Figure 6:
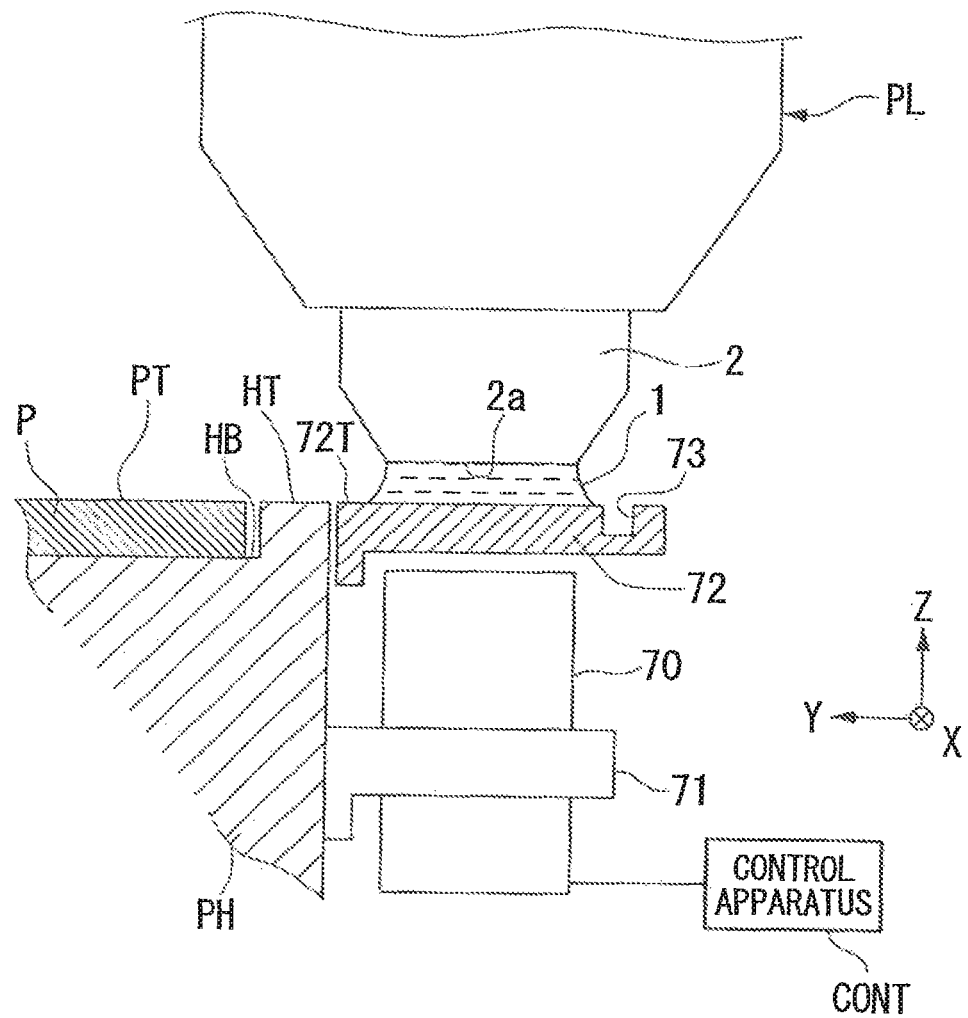
FIG. 6 is a diagram explaining a method of measuring wavefront aberration using a wavefront aberration measurement apparatus.

Next, the method of measuring the aberration of the projection optical system PL will be explained with reference to FIGS. 1, 3, and 6.

When starting the aberration measurement, the wavefront aberration measurement apparatus 70 is attached to the bracket 71. Each result of the measurement by the wavefront aberration measurement apparatus 70 is output to the control apparatus CONT. In accordance with the result of the measurement, the control apparatus CONT controls the imaging characteristic correction controller PA.

After the wavefront aberration measurement apparatus 70 is attached as described above, the liquid supply mechanism 10 supplies the liquid 1, so that the gap between the cover 72 and the liquid contact surface 2a of the optical element 2 is filled with the liquid 1. The liquid recovery mechanism 20 then collects the liquid 1 on the cover 72. Such supply and recovery of the liquid 1 is continuously and automatically performed. In the above state, the wavefront aberration measurement apparatus 70 measures the wavefront aberration of the projection optical system PL, where the measurement light from the wavefront aberration measurement apparatus 70 passes through the liquid 1 via the cover 72, which is a transparent member, thereby measuring the wavefront aberration when the liquid immersion exposure is performed. The wavefront aberration measurement apparatus 70 outputs a result of the measurement to the control apparatus CONT, and the control apparatus CONT appropriately controls the imaging characteristic correction controller PA so as to move and control each lens element of the projection optical system PL, thereby automatically performing the adjustment of the optical characteristics.

In the present embodiment, supply and recovery of the liquid 1 is continuously performed while the measurement of the wavefront aberration is performed using the wavefront aberration measurement apparatus 70. However, this is not a limitative condition. For example, supply and recovery of the liquid 1 may be stopped during the measurement, or may be intermittently performed. Such a supply and recovery operation may be appropriately selected in accordance with the structure of the measurement device, or the like.

As explained above, in the present wavefront aberration measurement, the cover 72 is provided above the wavefront aberration measurement apparatus 70; thus, it is possible to prevent the liquid 1 from leaking into or entering the wavefront aberration measurement apparatus 70. Therefore, preferable adjustment of the optical characteristics can be performed. In addition, the liquid 1 is provided onto the cover 72; however, the upper surface 72T of the cover 72 is liquid-repellent. Therefore, it is possible to prevent the liquid 1 from remaining on the cover 72. In addition, the groove portion 73 is provided. Therefore, even when the liquid 1 reaches the peripheral edge of the cover 72, the relevant liquid 1 is discharged through the groove portion 73; thus, it is possible to prevent the liquid 1 from leaking outside the peripheral edge of the cover 72. In addition, the positions of the upper surface PT of the substrate P, the upper surface HT of the substrate holder PH, and the upper surface 72T of the cover 72 are substantially the same along the Z axis; thus, the distance between the liquid contact surface 2a and the upper surface PT and the distance between the liquid contact surface 2a and the upper surface 72T are substantially the same. Therefore, the wavefront aberration measurement can be performed using the same amount of the liquid 1 as that used in the liquid immersion exposure, thereby further accurately performing the measurement. Additionally, not only the upper surface 72T of the cover 72, but also the upper surface HT of the substrate holder PH may have liquid-repellency.

A measurement process using the wavefront aberration measurement apparatus 70 is disclosed, for example, in the above-mentioned Japanese Published Unexamined Patent Application No. 2002-202221, and the disclosed content may be applied to the present invention.

Also in the present embodiment, ArF excimer laser light is used as the exposure light, and thus pure water is used as the liquid 1. Pure water can be easily obtained in large quantities at semiconductor fabrication plants or the like, and has an advantage in that it does not adversely affect the photoresist on the substrate P, the optical elements (lenses), or the like. In addition, pure water does not adversely affect the environment and has an extremely low impurity content, and can therefore be expected to also serve the function of cleaning the front surface of the substrate P, as well as the surface of the optical element provided at the head of the projection optical system PL. Further, because the refractive index a of (pure) water for the exposure light EL that has a wavelength of approximately 193 nm is substantially 1.44, the use of ArF excimer laser light (193 nm wavelength) as the light source of the exposure light EL would shorten the wavelength on the substrate P to i.e., to approximately 134 nm, thereby obtaining a high resolution. Furthermore, because the depth of focus will increase approximately a times, i.e., approximately 1.44 times, that of in air, the numerical aperture of the projection optical system PL can be further increased if it is preferable to ensure a depth of focus approximately the same as that when used in air, and the resolution is also improved from this standpoint.

In addition, although the embodiment discussed above explained a case wherein water is used as the liquid 1, it may he a liquid other than water; for example, if the light source of the exposure light EL is an $F_2$ laser, then the $F_2$ laser light is not transmitted through water, so it would he acceptable to use as the liquid 1 a fluorine-based fluid, such as fluorine-based oil or perfluoropolyether (PFPE), which is capable of transmitting $F_2$ laser light. In addition, it is also possible to use as the liquid 1 one (e.g., cedar oil) that is transparent to the exposure light EL, has the highest possible refractive index, and is stable with respect to the projection optical system PL and the photoresist provided on the surface of the substrate P.

In the present embodiment, the bracket 71 holds the wavefront aberration measurement apparatus 70 in a detachable manner. However, the present invention is not limited to such a structure. For example, as the measurement device, another optical measurement device such as an illuminance meter may be used, and the cover 72 may be implemented by a member which is light-transmissive for the light used in the measurement (or detection) of the measurement device. In addition, in the wavefront aberration measurement apparatus 70, a light-receiving part (i.e., light-detecting part) of the measurement light is included in a detachable portion. However, the present invention is not limited to such a structure. For example, the light-receiving part may always be provided at the exposure apparatus (i.e., the stage side), and a light source of the measurement light May be provided at the detachable portion. In addition, the cover 72 may have not only the light-transmissive characteristic, for the measurement light, but also a function of partially reflecting the measurement light so as to change the optical path of the measurement light.

In the present embodiment, the bracket 71 has a structure for holding a measurement apparatus (i.e., the wavefront aberration measurement apparatus 70). The holding operation may be manually or automatically performed. In the above explanation, measurement is performed while the gap between the optical element 2 of the projection optical system PL and the cover 72 is filled with the liquid 1. However, the present invention is not limited to this condition. For example, the present invention can be applied to a case in which another member is arranged in place of the optical element 2 and the wavefront aberration measurement apparatus 70 is used while a gap between this member and the cover 72 is filled with the liquid 1, or a case in which the wavefront aberration measurement apparatus 70 is used while only the liquid 1 is arranged on the cover 72, Such a variation may be used when, for example, the state of the liquid 1 is observed.

In addition, the bracket 71 is attached to the substrate holder PH; however, the position of the bracket 71 is not limited to this state. For example, the bracket 71 may be attached to the substrate stage PST. In addition, the bracket 71 may be attached to a fixed portion in the exposure apparatus EX if this attachment does not obstruct the movement of the substrate stage PST. In this case, when the wavefront aberration measurement apparatus 70 is used, the substrate stage PST may be moved to a predetermined position. Also in this case, after attaching the wavefront aberration measurement apparatus 70 to the bracket 71, the substrate stage PST (or the substrate holder PH) may be positioned so as to position the cover 72 on the optical axis or the optical path of the measurement light of the wavefront aberration measurement apparatus 70.

In addition, the bracket 71 may be attached to a movement mechanism, and when the measurement using the wavefront aberration measurement apparatus 70 is performed, this movement mechanism may be driven so that the wavefront aberration measurement apparatus 70 attached to the bracket 71 is positioned below the cover 72. Such a movement mechanism may be implemented using a rotation motor and an arm connected to the rotation motor, and the bracket 71 may be provided at the head of the arm so as to move the wavefront aberration measurement apparatus 70 to the predetermined position.

In another example, the wavefront aberration measurement apparatus 70 is always attached to the bracket 71 or a fixed portion, and when the measurement is performed, at least one of the cover 72 and the wavefront aberration measurement apparatus 70 is moved as described above so that the wavefront aberration measurement apparatus 70 is positioned below the cover 72 (i.e., the light-transmissive member), that is, the cover 72 is positioned on the optical axis or the optical path of the measurement light of the wavefront aberration measurement apparatus 70.

The present invention can also be applied to another measurement device which is detachably attached to a (substrate) stage, such as an illuminance meter disclosed in Japanese Published Unexamined Patent Application No. 2001-338868 and the corresponding U.S. Pat. No. 6,690, 455, or a deflection measurement device disclosed in Japanese Published Unexamined Patent Application No. 2005-005521 corresponding to Japanese Patent Application No. 2003-168037. As far as is permitted by the relevant national law or regulations, the disclosures of the abovementioned publications and the U.S. Patent are each hereby incorporated by reference.

In addition, the above-described embodiment employs the exposure apparatus in which the gap between the projection optical system PL and the substrate P is filled with a liquid, that is, the liquid is locally provided. However, the present invention can also be applied to a liquid immersion exposure apparatus in which a stage which holds a substrate to be exposed is moved in a liquid vessel, or a liquid immersion exposure apparatus in which a liquid vessel having a specific depth is formed on a stage and a substrate is held in the liquid vessel. The structure and the operation of the liquid immersion exposure apparatus in which a stage which holds a substrate to be exposed is moved in a liquid vessel is disclosed, for example, in Japanese Published Unexamined Patent Application No. H6-124873, and the liquid immersion exposure apparatus in which a liquid vessel having a specific depth is formed on a stage and a substrate is held in the liquid vessel is disclosed, for example, in Japanese Published Unexamined Patent Application No. H10-303114 or U.S. Pat. No. 5,825,043. As far as is permitted by the relevant national law or regulations, the disclosures of the abovementioned publications or the U.S. Patent are each hereby incorporated by reference.

The present invention can also be applied to an exposure apparatus having a movable exposure stage (i.e., the first stage) for holding a substrate to be processed (e.g., a wafer) and a measurement stage (i.e., the second stage) on which various measurement members or sensors are provided, as disclosed in Japanese Published Unexamined Patent Application No. H11-135400. In this case, the cover 72 or the bracket 71 for attaching the wavefront aberration measurement apparatus 70 may be provided at the measurement stage. As far as is permitted by the relevant national law or regulations, the disclosure of the abovementioned publication is hereby incorporated by reference.

In addition, the exposure apparatus to which the above-described liquid immersion method is applied has a structure in which a space on the e optical path on the emission side of a terminal optical member of the projection optical system PL is filled with a liquid (or pure water) so as to expose a wafer W (or substrate P). However, as disclosed in the booklet of PCT International Publication No. WO2004/019128, a space on the optical path on the incidence side of the terminal optical member of the projection optical system PL may also be filled with a liquid (or pure water). As far as is permitted by the relevant national law or regulations, the disclosure of the abovementioned booklet is hereby incorporated by reference.

Furthermore, the numerical aperture NA of the projection optical system may become 0.9 to 1.3 if the liquid immersion method as discussed above is used. If the numerical aperture NA of such a projection optical system increases, then random polarized light conventionally used as the exposure light may degrade imaging performance due to the polarization effect, and it is therefore preferable to use polarized illumination. In that case, it is better to illuminate with linearly polarized light aligned along the length of the line pattern of the line-and-space pattern of the mask (the reticle), and to emit a large amount of diffracted light of the S polarized light component (the TE polarized light component), a directional component of the polarized light, which is aligned along the length of the line pattern, from the pattern of the mask (the reticle). If the gap between the projection optical system PL and the resist deposited on the surface of the substrate P is filled with a liquid, then the transmittance through the resist surface increases for the diffracted light of the S polarized light component (the TE polarized light component), which contributes to the improvement of the contrast, compared with the case in which the gap between the projection optical system PL and the resist deposited on the surface of the substrate P is filled with air (i.e., a gas). Therefore, a high imaging performance can consequently be obtained even if the numerical aperture NA of the projection optical system exceeds 1.0. In addition, it is more effective to appropriately combine a phase shift mask, an oblique incidence illumination method (particularly, a dipole illumination method) making incidence direction along the length of the line pattern as disclosed in Japanese Published Unexamined Patent Application No. H06-188169, and the like. As far as is permitted by the relevant national law or regulations, the disclosure of the abovementioned publication is hereby incorporated by reference.

In addition, if the substrate P is exposed with a fine line-and-space pattern (e.g., a line-and-space of approximately 25 to 50 nm) using, for example, an ArF excimer laser as the exposure light, as well as using the projection optical system PL that has a reduction magnification of approximately 1/4, then the structure of a mask M (e.g., the fineness of the pattern or the thickness of the chrome) may cause the mask M to act as a polarizing plate due to a waveguide effect, and a larger amount of diffracted light of the S polarized light component (the TE polarized light component) in comparison with the diffracted light of the P polarized light component (the TM polarized light component), which decreases contrast, may be emitted from the mask. In this case as well, it is preferable to use the linear polarized light illumination as discussed above; however, even if the mask M is illuminated with random polarized light, a high resolution performance can be obtained by using a projection optical system with a large numerical aperture NA of 0.9 to 1.3.

In addition, if exposing a substrate P with an ultrafine line-and-space pattern of a mask M, then there is also a possibility that the P polarized light component (the TM polarized light component) will become greater than the S polarized light component (the TE polarized light component) due to a wire grid effect; however, if conditions are such that the substrate P is exposed with a line-and-space pattern larger than 25 nm by using ArF excimer laser as the exposure light, as well as using a projection optical system that has a reduction magnification of approximately 1/4, then a greater quantity of diffracted light of the S polarized light component (the TE polarized light component) than the diffracted light of the P polarized light component (the TM polarized light component) is emitted from the mask, and therefore a high imaging performance can be obtained even in the case of a projection optical system with a large numerical aperture NA of 0.9 to 1.3.

Furthermore, instead of the linear polarized light illumination (S polarized light illumination) aligned along the length of the line pattern of the mask (the reticle), it is also effective to combine the oblique incidence illumination method with a polarized light illumination method that linearly polarizes light in a direction tangential (or circumferential) to a circle whose center is on the optical axis. In particular, if the mask (reticle) pattern includes line patterns extending in a plurality of different directions, instead of a line pattern extending in a prescribed single direction, then by combining a zonal illumination method with the polarized light illumination method that linearly polarizes light in a direction tangential to a circle whose center is on the optical axis, it is possible to achieve high imaging performance even if the numerical aperture NA of the projection optical system is large.

In addition, the substrate P is not limited to a semiconductor wafer for fabricating semiconductor devices, and is also applicable to a glass substrate for a display device, a ceramic wafer for a thin film magnetic head, an original plate (such as a synthetic silica glass plate or a silicon wafer) of a mask or a reticle used in the exposure apparatus, and the like.

In addition to a step-and-scan system scanning type exposure apparatus (scanning stepper) for performing scanning and exposure using the pattern of the mask M by synchronously moving the mask M and the substrate P, the exposure apparatus EX can also be adapted to a step-and-repeat system projection exposure apparatus (stepper) for performing exposure of the full pattern of the mask M with the mask M and the substrate P in a stationary state and sequentially moves the substrate P step by step. In addition, the present invention can also be adapted to a step-and-stitch system exposure apparatus that partially superimposedly transfers at least two patterns onto the substrate P.

In addition, the present invention can also be adapted to a twin-stage type exposure apparatus disclosed in Japanese Published Unexamined Patent Application No. H10-163099 and the corresponding U.S. Pat. No. 6,341,007, Japanese Published Unexamined Patent Application No. H10-214783 and the corresponding U.S. Pat. No. 6,341,007, Published Japanese Translation No. 2000-505958 of the PCT International Publication and the corresponding U.S. Pat. No. 5,969,441, and the like.

Furthermore, as far as is permitted by the relevant national law or regulations, the disclosures of the abovementioned publications are each hereby incorporated by reference.

The type of the exposure apparatus EX is not limited to semiconductor device fabrication exposure apparatuses that expose a substrate P with the pattern of a semiconductor device, but can also be widely adapted to exposure apparatuses for fabricating liquid crystal devices or displays, exposure apparatuses for fabricating thin-film magnetic heads, imaging devices (CCDs), or reticles and masks, or the like.

In addition, if a linear motor (refer to U.S. Pat. No. 5,623,853 or U.S. Pat. No. 5,528,118) is used in the substrate stage PST or the mask stage MST, then either an air levitation type that uses an air bearing, or a magnetic levitation type that uses Lorentz's force or reactance three, may be preferably used as a method for levitating such a stage from the surface plate. In addition, each stage PST or MST may be a type that moves along a guide, or may be a guideless type. As far as is permitted by the relevant national law or regulations, the disclosure of the abovementioned U.S. Patent is hereby incorporated by reference.

The driving mechanism for each stage PST or MST may be implemented using a plane motor which has a magnetic unit in which magnets are two-dimensionally arranged and an armature unit in which coils are two-dimensionally arranged, wherein both units face each other, so as to drive each stage PST or MST by using electromagnetic force. In this case, any one of the magnetic unit and the armature unit may be connected to the stage PST or MST, and the other one may he provided on a plane on which the stage PST or MST moves.

The reaction force generated by the movement of the substrate stage PST may be mechanically discharged to the floor (ground) using a frame member as disclosed in Japanese Published Unexamined Patent Application No. H08-166475 and the corresponding U.S. Pat. No. 5,528,118, so that the movement is not transmitted to the projection optical system PL. As far as is permitted by the relevant national law or regulations, the disclosure of the abovementioned U.S. patent is hereby incorporated by reference.

The reaction force generated by the movement of the mask stage MST may be mechanically discharged to the floor (ground) using a frame member as disclosed in Japanese Published Unexamined Patent Application No. H08-330224 and the corresponding U.S. Pat. No. 5,874,820, so that the movement is not transmitted to the projection optical system PL. As far as is permitted by the relevant national law or regulations, the disclosure of the abovementioned U.S. patent is hereby incorporated by reference.

The exposure apparatus EX in the present embodiment is manufactured by assembling various subsystems, including each constituent element recited in the claims of the present application, so that a prescribed mechanical accuracy, electrical accuracy, and optical accuracy are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems.

The process of assembling he exposure apparatus from the various subsystems includes the mutual mechanical connection of the various subsystems, the wiring and connection of electrical circuits, the piping and connection of the atmospheric pressure circuit, and the like. Naturally, before the process of assembling the exposure apparatus from the various subsystems, there is also the process of assembling each individual subsystem. When the process of assembling the exposure apparatus from the various subsystems is finished, a comprehensive adjustment is performed to ensure the various accuracies of the exposure apparatus as a whole. Furthermore, it is preferable to manufacture the exposure apparatus in a clean room wherein the temperature, the cleanliness level, and the like, are controlled.

Figure 7:
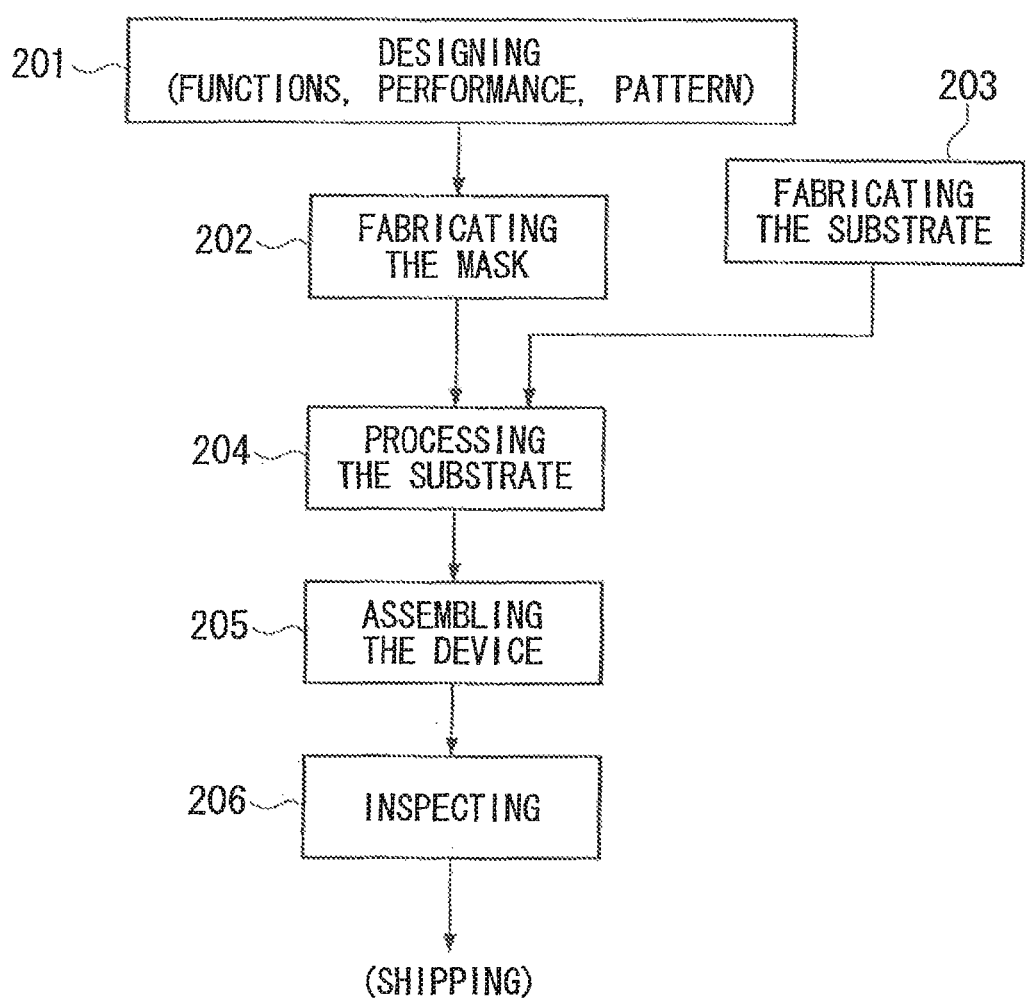
FIG. 7 is a flow chart diagram that depicts one example of a process for manufacturing a semiconductor device.

In addition, as shown in FIG. 7, a micro-device, such as a semiconductor device, is manufactured by a step 201 that designs the functions and performance of the micro-device; a step 202 that fabricates a reticle (or a mask) based on this design step; a step 203 that fabricates a substrate, which is the base material of the device; an exposure processing step 204 wherein the exposure apparatus EX of the embodiments discussed above exposes the substrate with a pattern of the reticle; a device assembling step 205 (including a dicing process, a bonding process, and a packaging process); an inspecting step 206; and the like.

What is claimed is:
1. An exposure apparatus comprising:
a projection system;
a liquid supply system having a supply opening via which liquid is supplied to a space under the projection system;
a liquid recovery system having a recovery opening via which the supplied liquid is collected;
a supply flow meter fluidically connected to the supply opening;
a stage system having a movable stage apparatus on which a substrate is held; and
a measurement system which measures a wavefront aberration and has a light receiving part which receives a light from the projection system through a light-transmissive member provided at the movable stage appa- ratus and the liquid between the projection system and the light-transmissive member, wherein a liquid immersion area is formed on a portion of an upper surface of the substrate while performing liquid supply via the supply opening and liquid collection via the recovery opening, and wherein the substrate is exposed through the liquid in the liquid immersion area.

2. The apparatus according to claim 1, further comprising a recovery flow-meter fluidically connected to the recovery opening.

3. The apparatus according to claim 2, wherein the recovery flow-meter is provided downstream of the recovery opening.

4. The apparatus according to claim 2, wherein the recovery flow-meter measures an amount of the liquid collected via the recovery opening.

5. The apparatus according to claim 2, further comprising a separator fluidically connected to the recovery opening, which separates one of the liquid and gas, which has been collected via the recovery opening, from the other, wherein the recovery flow-meter measures an amount of the liquid separated by the separator.

6. The apparatus according to claim 1, wherein the movable stage apparatus is moved below the recovery opening.

7. The apparatus according to claim 1, wherein the supply flow-meter is provided upstream of the supply opening.

8. The apparatus according to claim 1, wherein the supply flow-meter measures an amount of the liquid to be supplied via the supply opening.

9. The apparatus according to claim 1, further comprising a separator fluidically connected to the recovery opening, which separates one of the liquid and gas, which has been collected via the recovery opening, from the other.

10. The apparatus according to claim 1, wherein the movable stage apparatus is moved below the supply opening.

11. The apparatus according to claim 1, Wherein the light-transmissive member is a lens.

12. The apparatus according to claim 1, wherein the light-transmissive member has an upper surface that is substantially coplanar with the upper surface of the substrate held on the movable stage apparatus.

13. The apparatus according to claim 12, wherein the movable stage apparatus has an upper surface that is substantially coplanar with the upper surface of the light-transmissive member.

14. The apparatus according to claim 13, wherein the movable stage apparatus has a holder configured to hold the substrate such that the upper surface of the movable stage apparatus and the upper surface of the substrate are substantially coplanar.

15. The apparatus according to claim 1, wherein the stage system has a mover which has an electromagnetic motor to move the movable stage apparatus.

16. A device manufacturing method comprising:
exposing a substrate using the apparatus according to claim 1; and
processing the exposed substrate.

17. An exposure method comprising:
forming a liquid immersion area under a projection system while performing liquid supply via a supply opening and liquid collection via a recovery opening;
measuring an amount of liquid supplied from the supply opening using a flowmeter;
moving a movable stage apparatus below the projection system, the supply opening and the recovery opening such that the liquid immersion area is formed between the projection system and a light-transmissive member provided at the movable stage apparatus;
measuring a wavefront aberration by receiving light from the projection system through the light-transmissive member provided at the movable stage apparatus and the liquid between the projection system and the light-transmissive member;
moving the movable stage apparatus such that the liquid immersion area is formed between the projection system and an upper surface of a substrate held on the movable stage apparatus; and
exposing the substrate through the liquid in the liquid immersion area formed between the projection system and the upper surface of the substrate.

18. The method according to claim 17, further comprising measuring an amount of the liquid recovered from the recovery opening using a recovery flowmeter.

19. The method according to claim 18, further comprising separating one of the liquid and gas, which has been collected via the recovery opening, from the other using a separator, wherein the recovery flowmeter measures the amount of the liquid separated using the separator.

20. The method according to claim 17, wherein the light-transmissive member is a lens.

21. The method according to claim 17, wherein the light-transmissive member has an upper surface that is substantially coplanar with the upper surface of the substrate held on the movable stage apparatus.

22. The method according to claim 21, wherein the movable stage apparatus has an upper surface that is substantially coplanar with the upper surface of the light-transmissive member.

23. The method according to claim 22, wherein the movable stage apparatus has a holder configured to hold the substrate such that the upper surface of the movable stage apparatus and the upper surface of the substrate are substantially coplanar.

* * * * *